United States Patent
Tabatowski-Bush et al.

(10) Patent No.: US 9,217,781 B2
(45) Date of Patent: Dec. 22, 2015

(54) TIME SYNCHRONIZATION BETWEEN BATTERY CONTROLLER MODULES FOR PARAMETER MEASUREMENTS

(71) Applicant: FORD GLOBAL TECHNOLOGIES, LLC, Dearborn, MI (US)

(72) Inventors: Ben A. Tabatowski-Bush, South Lyon, MI (US); Ai Keramidas, West Bloomfield, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 143 days.

(21) Appl. No.: 14/156,569

(22) Filed: Jan. 16, 2014

(65) Prior Publication Data

US 2015/0198672 A1 Jul. 16, 2015

(51) Int. Cl.
*G01R 31/36* (2006.01)
*H01M 10/48* (2006.01)

(52) U.S. Cl.
CPC ........ *G01R 31/3648* (2013.01); *G01R 31/3606* (2013.01); *G01R 31/3651* (2013.01); *G01R 31/3658* (2013.01); *H01M 10/482* (2013.01); *H01M 2220/20* (2013.01)

(58) Field of Classification Search
CPC ...................................................... H02J 7/0093
USPC ......................................................... 320/133
See application file for complete search history.

(56) References Cited

U.S. PATENT DOCUMENTS

| 2004/0164706 | A1 | 8/2004 | Osborne |
| 2007/0236181 | A1 | 10/2007 | Palladino |
| 2010/0161260 | A1 | 6/2010 | Kao et al. |
| 2011/0204898 | A1 | 8/2011 | Kim et al. |
| 2012/0242144 | A1 | 9/2012 | Chorian et al. |
| 2012/0242344 | A1 | 9/2012 | Ishishita |
| 2013/0226377 | A1 | 8/2013 | Stanek et al. |
| 2013/0322462 | A1 * | 12/2013 | Poulsen ........................ 370/458 |

* cited by examiner

*Primary Examiner* — Thuan Do
(74) *Attorney, Agent, or Firm* — David B. Kelley; MacMillan, Sobanski & Todd, LLC

(57) ABSTRACT

A multi-cell battery pack in an electric vehicle is monitored by multiple sensing modules. A primary controller is coupled to a first plurality of cells to measure a predetermined parameter of each cell. The primary controller determines a sampling moment recurring at a fixed frequency for sampling the predetermined parameter of each of the first plurality of cells. The primary controller generates a sync pulse at each sample moment. A secondary controller is coupled to a second plurality of cells to measure the predetermined parameter of each cell. The secondary controller receives the sync pulse to start a pulse generator operating at a frequency which is a predetermined multiple of the primary controller fixed frequency. The secondary controller counts pulses generated by the pulse generator and schedules a synchronized secondary sampling moment according to a predetermined pulse count.

19 Claims, 4 Drawing Sheets

TIME SYNCHRONIZATION BETWEEN BATTERY CONTROLLER MODULES FOR PARAMETER MEASUREMENTS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to battery monitoring in electric vehicles, and, more specifically, to synchronizing measurements made by separate modules for different cells in a multi-cell battery or battery packs.

The DC power source (e.g., a battery) and other elements of electric drives for full electric vehicles or hybrid electric vehicles require monitoring in order to maximize efficiency and performance as well as to detect potential malfunctions. Common battery types such as lithium ion (Li-Ion) use a large number of individual battery cells stacked together into a battery pack. Besides monitoring the total voltage output by a battery pack, each cell is typically monitored individually to determine their voltage production, current, and other parameters. The temperature of each cell is also monitored in order to protect against overheating.

It is very challenging to reliably monitor the various battery conditions because of the high-voltage levels involved, the range of intermediate voltages at which respective cells operate within the stack, and the high levels of accuracy required. Various battery monitoring integrated circuit devices have been developed commercially for use in the vehicle environment. Examples of a commercially available battery monitoring IC device include the AD7280A device available from Analog Devices, Inc., of Norwood, Mass., the LTC6804 devices available from Linear Technology Corporation of Milpitas, Calif., and the ISL94212 Multi-Cell Li-Ion Battery Manager available from Intersil Corporation of Milpitas, Calif.

A typical Battery Energy Controller Module (BECM) uses an IC device that includes or can be programmed to include various battery management and communication functions in addition to the monitoring functions. Due to space limitations, however, a BECM device typically includes inputs for monitoring no more than about a hundred individual battery cells. A single battery pack can have over one hundred cells, and some vehicles may include more than one battery pack. Therefore, a Battery Pack Sensing Module (BPSM) is often used with additional monitoring ICs to measure the parameters for other cells and report them to the BECM.

In order to accurately measure and evaluate various parameters associated with the individual battery cells, it becomes important to synchronize the measurements taken for the plurality of cells. Due to changes in load, for example, the individual cell voltages and currents may change very quickly so that measurements made at different sampling times diminish the ability to accurately compare performance of one cell against another. Each monitoring IC samples all of its cells in parallel at one time, referred to as the sampling moment.

Since each BPSM contains an internal time reference, the measurements for its cells are easily synchronized. When multiple ICs are required due to a high number of cells in the battery pack(s), however, coordinating signals between the separate BPSM s may be necessary. As suggested in US Patent Application Publication 2010/0161260 A1, an externally generated timing pulse can be distributed to each of the BPSM s so that sampling of the battery cell parameters can be triggered simultaneously. This manner of synchronization has the disadvantages of not being able to provide advance notification of a measurement to allow any preparatory steps to be taken in an IC, and any failure to generate or detect the timing signal may go undetected and missing measurements may result.

Another solution has been to allow a BECM to generate its sampling moment internally and then send a multiplex message to the BPSM upon the occurrence of the sampling moment. Multiplex messages, however, include inherent delays in message arbitration and transmission that may create undesirable delays between the primary sampling moment of the BECM and the secondary sampling moment of the BPSM.

SUMMARY OF THE INVENTION

In one aspect of the invention, apparatus is provided for an electric vehicle having at least one multi-cell battery pack. A primary controller is coupled to a first plurality of cells to measure a predetermined parameter of each cell. The primary controller determines a sampling moment recurring at a fixed frequency for sampling the predetermined parameter of each of the first plurality of cells. The primary controller generates a sync pulse at each sample moment. A secondary controller is coupled to a second plurality of cells to measure the predetermined parameter of each cell. The secondary controller receives the sync pulse to start a pulse generator operating at a frequency which is a predetermined multiple of the primary controller fixed frequency. The secondary controller counts pulses generated by the pulse generator and schedules a secondary sampling moment according to a predetermined pulse count.

DETAILED DESCRIPTION OF PREFERRED EMBODIMENTS

The term "electric vehicle" as used herein includes vehicles having an electric motor for vehicle propulsion, such as battery electric vehicles (BEV), hybrid electric vehicles (HEV), and plug-in hybrid electric vehicles (PHEV). A BEV includes an electric motor, wherein the energy source for the motor is a battery that is re-chargeable from an external electric grid. In a BEV, the battery is the source of energy for vehicle propulsion. A HEV includes an internal combustion engine and an electric motor, wherein the energy source for the engine is fuel and the energy source for the motor is a battery. In a HEV, the engine is the main source of energy for vehicle propulsion with the battery providing supplemental energy for vehicle propulsion (e.g., the battery buffers fuel energy and recovers kinematic energy in electric form). A PHEV is like a HEV, but the PHEV has a larger capacity battery that is rechargeable from the external electric grid. In a PHEV, the battery is the main source of energy for vehicle propulsion until the battery depletes to a low energy level, at which time the PHEV operates like a HEV for vehicle propulsion.

Figure 1:
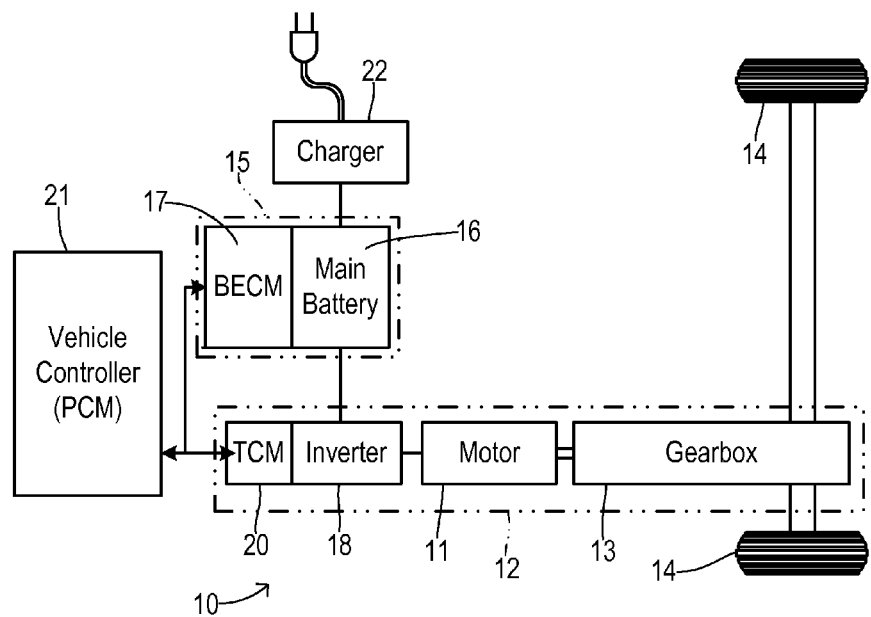
FIG. 1 is a block diagram showing one type of electric vehicle having a main battery pack and a battery energy control module.

By way of example, FIG. 1 depicts a vehicle 10 as a battery electric vehicle (BEV) propelled by an electric motor 11 without assistance from an internal combustion engine. Motor 11 receives electrical power and provides drive torque for vehicle propulsion. Motor 11 also functions as a generator for converting mechanical power into electrical power through regenerative braking. Motor 11 is part of a powertrain 12 in which a gearbox 13 couples motor 11 to driven wheels 14. Gearbox 13 adjusts the drive torque and speed of motor 11 by a predetermined gear ratio.

Vehicle 10 includes a battery system 15 including a main battery pack 16 and a battery energy controller module (BECM) 17. An output of battery pack 16 is connected to an inverter 18 which converts the direct current (DC) power supplied by the battery to alternating current (AC) power for operating motor 11 in accordance with commands from a traction control module (TCM) 20. TCM 20 monitors, among other things, the position, speed, and power consumption of motor 11 and provides output signals corresponding to this information to other vehicle systems including a main vehicle controller 21 (which may be a powertrain control module, or PCM, for example).

An AC charger 22 is provided for charging main battery 16 from an external power supply (not shown), such as the AC power grid. Although vehicle 10 is shown as a BEV, the present invention is applicable to any electric vehicles using a multi-cell battery pack including HEVs and PHEVs.

Figure 2:
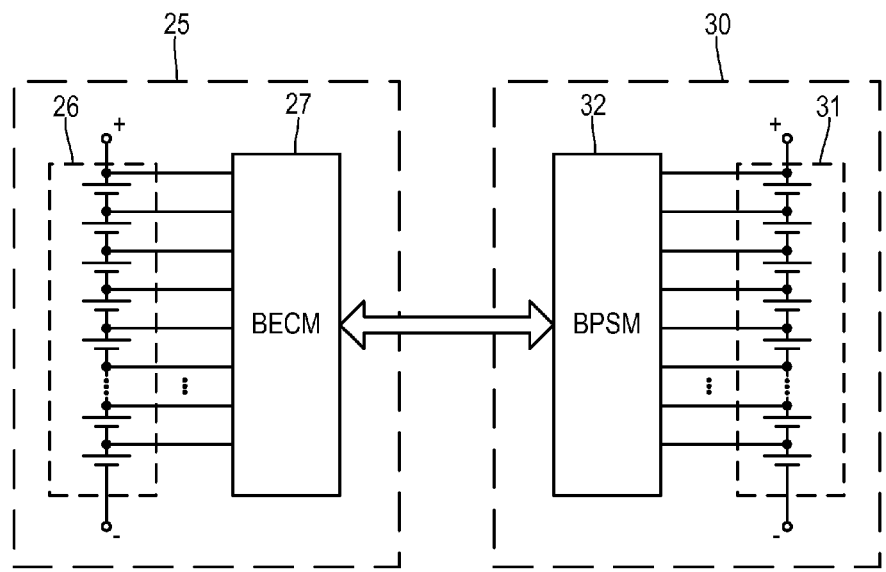
FIG. 2 is a schematic diagram showing multi-cell battery packs and associated modules for sensing battery cell voltage and current.

FIG. 2 shows an embodiment of the invention in greater detail wherein a first battery pack 25 includes a multi-cell battery 26 packaged together with a battery energy controller module (BECM) 27. Each individual cell of battery 26 is coupled to respective sampling inputs of BECM 27. A second battery pack 30 includes multi-cell battery 31 with individual cells coupled to respective sampling inputs of a battery pack sensing module (BPSM) 32. BECM 27 acts as a primary controller and as a master to BPSM 32 which acts as a secondary controller to provide measurements of predetermined cell parameters of battery 31 to BECM 27. Although BECM 27 and BPSM 32 are shown in separate battery packs, the present invention can also be used when a secondary BPSM is connected to respective individual cells in the same battery pack with BECM 27.

Figure 3:
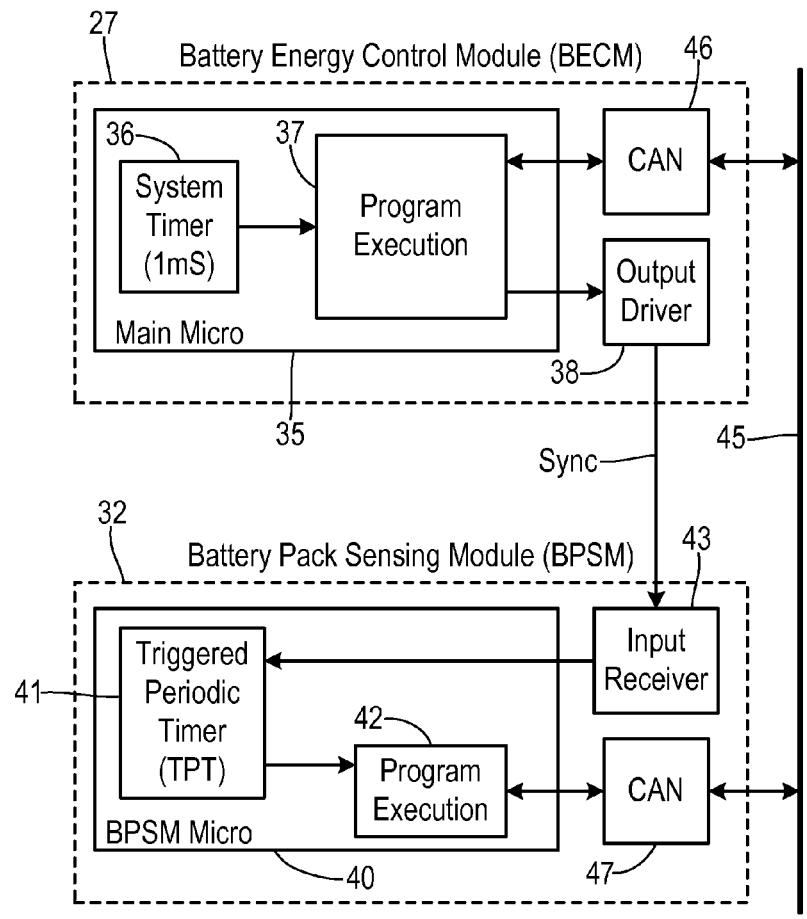
FIG. 3 is a block diagram showing one embodiment of the modules of the present invention in greater detail.

The interconnections between BECM 27 and BPSM 32 are shown in greater detail in FIG. 3. BECM 27 has a main microcontroller 35 including a system timer 36 and a program execution block 37. An output driver 38 controlled by program block 37 may be comprised of a peripheral circuit device for generating a sync signal to be sent to BPSM 32.

BPSM 32 includes a microcontroller 40 having a triggered periodic timer 41 and a program execution block 42. An input receiver 43 is a peripheral circuit for receiving a sync pulse from output driver 38 and forwarding the received sync pulse to triggered periodic timer 41. A multiplex bus 45 (such as a CAN bus) interconnects BECM 27 and BPSM 32 via a CAN node 46 in BECM 27 and a CAN node 47 in BPSM 32. The present invention starts periodic timer 41 simultaneously with the reception of a sync pulse from BECM and then measures a time corresponding to the heartbeat period of BECM 27 in order for BPSM 32 to create an internal time reference that is synchronized with the time reference used in BECM 27. This allows BPSM 32 to know in advance when a sampling moment is expected and to be able to detect when the reception of sync pulses may have been disrupted.

BECM 27 acts as the primary controller and determines a primary sampling moment which triggers the sampling of all the individual battery cells connected to BECM 27. The primary sampling moment recurs at a fixed frequency defined by a main heartbeat signal that is derived from system timer 36. In the present example, system timer 36 generates a clock tick every 1 milliseconds (mS), for example. Based on the 1 mS clock ticks, a predetermined task signal (i.e., heartbeat) is generated according to a specific period such as 100 ms in order to provide the scheduling of predetermined tasks that are repeatedly performed as part of the functioning of BECM 27. One of these predetermined tasks is the sampling of a predetermined parameter of the individual battery cells connected to BECM 27, such as battery cell voltage. Like the heartbeat signal, the sampling moment occurs at a repetition period of 100 mS, but is not necessarily simultaneous with the main heartbeat. By scheduling the primary sampling moment between heartbeat signals, the measurement results and related calculations can be finished before the next heartbeat signal, since they may be used by other processes or functions that occur on the heartbeat signal.

Figure 4:
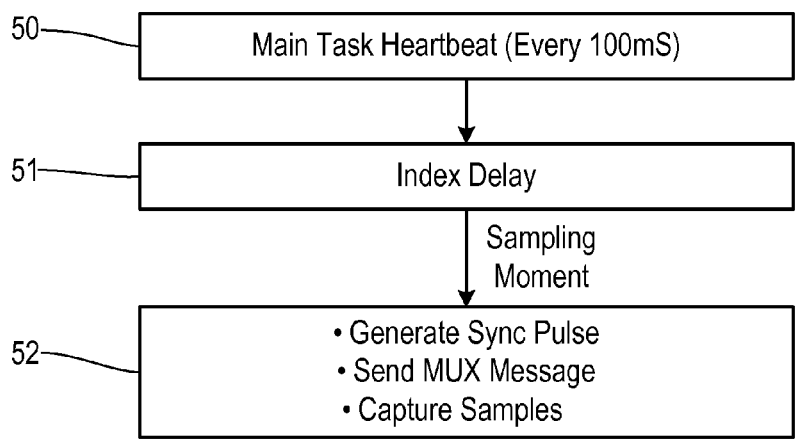
FIG. 4 is a process diagram showing the timing of a sampling moment in the primary controller in one embodiment of the invention.

Operation within BECM 27 is shown in greater detail in FIG. 4. Thus, a main task signal (i.e., heartbeat) is generated every 100 mS as shown in block 50. In block 51, an index delay is generated as a fixed offset from the main task heartbeat (e.g., 80 ms after each heartbeat). After the index delay, the primary sampling moment occurs when the functions shown in block 52 are immediately performed, preferably including i) the generation of a sync pulse, ii) the generation of a multiplex message, and iii) the capturing of the samples for the predetermined parameter (e.g., voltage or current) of the first plurality of cells which are connected to primary controller BECM 27.

Figure 5:
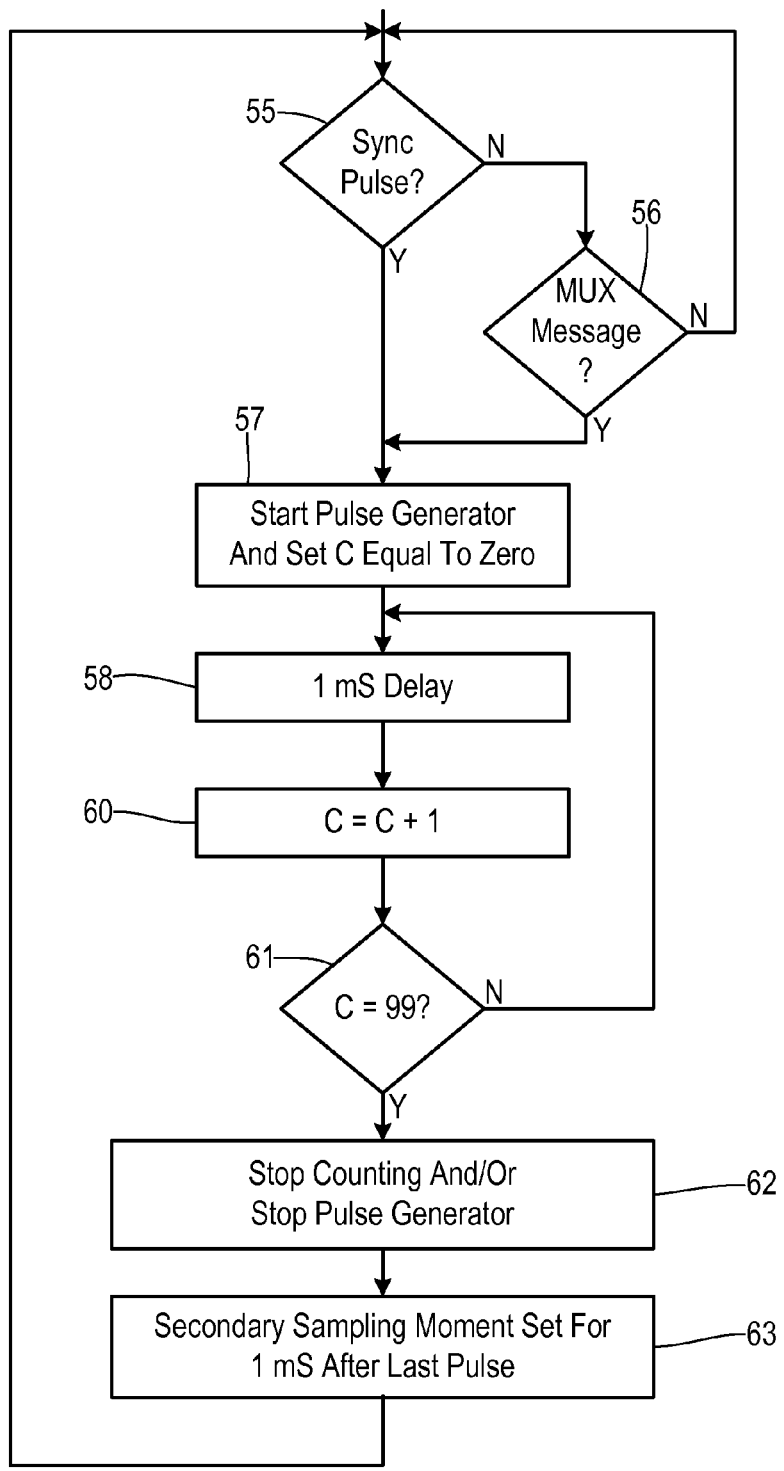
FIG. 5 is a flowchart showing one preferred method for determining a secondary sampling moment in the secondary controller which is synchronized with the primary sampling moment.

The operation within BPSM 32 is shown according to one preferred method in FIG. 5. In step 55, a check is performed to determine whether a sync pulse has been received from the primary controller. If not, then a check is performed in step 56 to determine whether a multiplex message indicating the occurrence of the secondary sampling moment has occurred in step 56. If not, then a return is made to step 55 for further monitoring for a sync pulse. Thus, in the event that operation according to the sync pulses has failed, the notification of the occurrence of the primary sampling moment received by way of a multiplex message operates as a backup to ensure that measurements are still taken by the secondary controller with a timing that is relatively close to the timing of the primary controller.

After being triggered by receipt of a sync pulse in step 55 or receipt of a multiplex message in step 56, the secondary BPSM controller starts a pulse generator (i.e., the triggered periodic timer) in step 57 and sets a count value C equal to zero. The pulse generator counts at the same tick rate as the system timer in the primary controller (e.g., 1 ms), subject to any discrepancies between the timing references in the two separate ICs. Step 58 represents the 1 ms delay occurring between pulses generated by the pulse generator. In step 60, count C is incremented by one, and the current count value C is compared to a value of 99 in step 61. If a count value of 99 has not yet been reached, then a return is made to step 58 to wait for completion of the next 1 ms delay and further incrementing of the count in step 60 for a subsequent pulse. Once the count value has increased to 99, then the counting is stopped (and/or the pulse generator is stopped) in step 62. In step 63, the secondary sampling moment is scheduled such that it will occur 1 ms after the last counted pulse.

As demonstrated by the foregoing example, the pulse generator formed by the triggered periodic timer in the secondary BPSM generates pulses at a frequency which is a predetermined multiple of the fixed frequency at which the sampling moments are generated in the primary BECM. By operating at a predetermined multiple of the fixed frequency, the secondary controller can predict an upcoming occurrence of a sync pulse so it can both prepare for the upcoming measurements and schedule other events in relation to the secondary sampling moment that are synchronized with events occurring in the primary BECM. In the present example, the main task heartbeat is generated every 100 ms, resulting in a primary sampling moment generated at a frequency of 10 per second. With the pulse generator configured to operate at 1000 pulses per second (so that the predetermined multiple is equal to 100) and with the pulse generator being initially started synchronously by the previous sync pulse, each 100th pulse from the pulse generator would normally be generated substantially simultaneously with a next succeeding sync pulse. Therefore, the timing for a secondary sampling moment generated within the secondary controller is obtained by counting pulses from the pulse generator equal to the predetermined multiple minus one, and then waiting a fixed delay corresponding to the same pulse period (e.g., 1 mS) in order to identify a synchronized timing for the secondary sampling moment.

Figure 6:
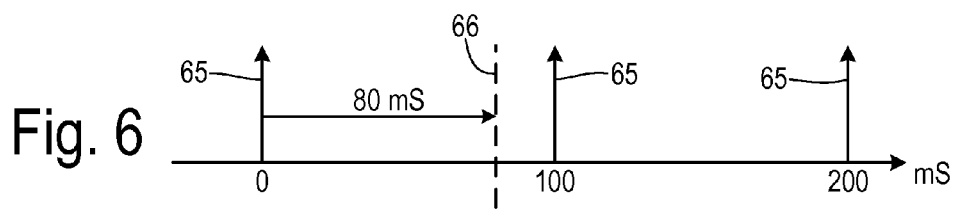
FIG. 6 is a timing diagram showing a task signal and the scheduling of the primary sampling moment by the primary controller.
Figure 7:
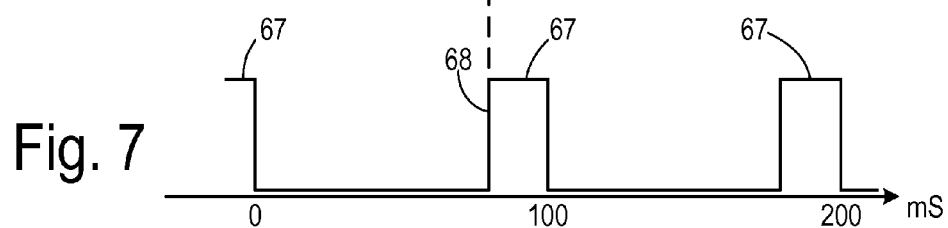
FIG. 7 is a timing diagram showing a sync signal generated by the primary controller, on the same time scale as FIG. 6.
Figure 8:
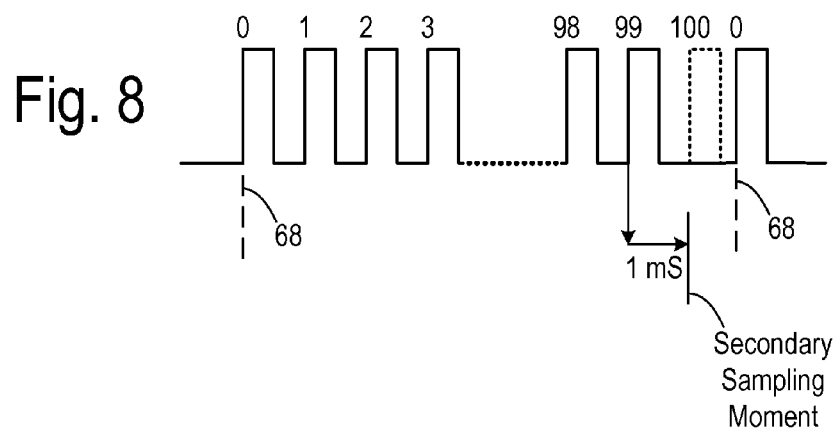
FIG. 8 shows a series of pulses generated by a pulse generator in the secondary controller which is triggered in response to the sync signal.

The desired timing is shown in greater detail in FIGS. 6-8. In FIG. 6, a plurality of main task heartbeats or task signals 65 are generated every 100 ms. Scheduling of the primary sampling moment is set to follow an 80 ms delay after each task heartbeat, resulting in a primary sampling moment 66. FIG. 7 shows a sync pulse generated by the BECM as a train of pulses 67. Each sync pulse 67 has a leading edge 68 coincident with a respective primary sampling moment 66. Each sync pulse preferably has a predetermined pulse width (i.e., duty cycle), such as about 20 mS. Based on the target characteristics used by the primary controller to generate the nominal sync pulses, the secondary controller can measure the actual characteristics of the sync signal as received from the primary controller. Then the secondary controller can compares the measured characteristics to predetermined limits around the target characteristics in order to detect validity of the sync signal, and when the comparison detects invalidity then the secondary controller can enter a mode which only starts the pulse generator in response to the multiplex message.

FIG. 8 shows the counting of pulses (e.g., as counted by the program execution block of the BPSM microcontroller) generated by the triggered periodic timer. At a time of 0 mS, a sync pulse is received and the pulse generator is started so that a first pulse is generated almost simultaneously (e.g., within 20 microseconds) with the sync pulse. The count is reset by the sync pulse, so that the first pulse has a count of zero. After 1 mS, the next pulse in the pulse train is generated and the count is incremented to one. After 2 mS, a pulse is generated that results in the count being incremented to two. After 99 mS, the count is equal to the predetermined multiple (i.e., 100) minus one. When a count of 99 is detected, the counting is stopped. Thus, the next counted pulse which would be the $100^{th}$ pulse is not counted. Instead, the secondary sampling moment is implemented at 1 mS after pulse 99. Meanwhile, the next sync pulse should be received at about the time that the $100^{th}$ pulse would have been internally generated. Therefore, the next pulse 0 is shown as occurring at a time of 100 mS. Assuming that generation and reception of the sync pulse are performing properly, pulse 0 would occur very close in time to when pulse 100 would have occurred—separated only by an amount proportional to any error between the timing references of the two ICs. Since each new pulse count is triggered by an accurate sync signal from the primary controller, an error does not accumulate in the timing used by the secondary controller.

As used herein, the predetermined parameter that is measured at the sampling moments can be the individual cell voltages. Alternatively, the predetermined parameter can be current or any other desired parameter. In addition, some parameters can be measured at other times or at other repetition rates than at the heartbeat rate. For example, current measurements can be taken at 2 mS intervals. Measurements of the battery pack voltages (e.g., the voltages across different pluralities of cells) may be taken every 10 mS. These and other sampling times can be easily determined based on the ongoing pulse count.

What is claimed is:

1. Apparatus for an electric vehicle having at least one multi-cell battery pack, comprising:
    a primary controller coupled to a first plurality of cells to measure a predetermined parameter of each cell, the primary controller determining a sampling moment recurring at a fixed frequency for sampling the predetermined parameter of each of the first plurality of cells, wherein the primary controller generates a sync pulse at each sample moment;
    a secondary controller coupled to a second plurality of cells to measure the predetermined parameter of each cell of the second plurality, the secondary controller receiving the sync pulse directly from the primary controller to start a pulse generator operating at a frequency which is a predetermined multiple of the primary controller fixed frequency, the secondary controller counting pulses generated by the pulse generator and scheduling a secondary sampling moment according to a predetermined pulse count.

2. The apparatus of claim 1 wherein the pulse counting is stopped after reaching a count equal to the predetermined multiple minus one, and wherein the secondary sampling moment occurs at a fixed delay after a last counted pulse.

3. The apparatus of claim 1 wherein the primary controller and secondary controller are connected by a multiplex bus, wherein the primary controller initiates a multiplex message to the secondary controller at each sampling moment, and wherein the secondary controller starts the pulse generator upon receipt of each multiplex message only if the pulse generator is not already started.

4. The apparatus of claim 3 wherein the secondary controller measures predetermined characteristics of the sync signal, compares the measured characteristics to predetermined limits to detect validity, and when the comparison detects invalidity then only starts the pulse generator in response to the multiplex message.

5. The apparatus of claim 1 wherein the predetermined parameter is comprised of cell voltage.

6. The apparatus of claim 1 wherein the secondary controller schedules another sampling moment for another parameter at another pulse count.

7. The apparatus of claim 6 wherein the another parameter is comprised of cell current.

8. The apparatus of claim 6 wherein the another parameter is comprised of a voltage across a plurality of cells.

9. The apparatus of claim 1 wherein the primary controller is comprised of a battery energy controller module, and wherein the secondary controller is comprised of a battery pack sensing module.

10. The apparatus of claim 1 wherein the first plurality of cells are arranged in a first battery pack and the second plurality of cells are arranged in a second battery pack.

11. A method of synchronizing parameter measurements of a multi-cell battery in an electric vehicle, comprising;
a primary controller coupled to a first plurality of battery cells determining a primary sampling moment recurring at a fixed frequency;
at the primary sampling moment, the primary controller generating a sync pulse and sampling a predetermined parameter of each of the first plurality of battery cells;
a secondary controller coupled to a second plurality of battery cells starting a pulse generator operating at a frequency which is a predetermined multiple of the primary controller fixed frequency in response to receiving the sync pulse directly from the primary controller;
the secondary controller counting pulses generated by the pulse generator and scheduling a secondary sampling moment according to a predetermined pulse count; and
the secondary controller sampling the predetermined parameter of each battery cell of the second plurality at the secondary sampling moment.

12. The method of claim 11 wherein the pulse counting is stopped after reaching a count equal to the predetermined multiple minus one, and wherein the secondary sampling moment is scheduled at a fixed delay after a last counted pulse.

13. The method of claim 11 wherein the primary controller and secondary controller are connected by a multiplex bus, and further comprising the steps of:
the primary controller initiating a multiplex message to the secondary controller at each primary sampling moment; and
the secondary controller starting the pulse generator upon receipt of each multiplex message if the pulse generator is not already started.

14. The method of claim 13 further comprising the steps of:
the secondary controller measuring predetermined characteristics of the sync signal;
comparing the measured characteristics to predetermined limits to detect validity; and
when the comparison detects invalidity then inhibiting the starting of the pulse generator in response to the sync signal.

15. The method of claim 11 wherein the predetermined parameter is comprised of cell voltage.

16. The method of claim 11 further comprising the step of the secondary controller scheduling another sampling moment for another parameter at another pulse count.

17. The method of claim 16 wherein the another parameter is comprised of cell current.

18. The method of claim 16 wherein the another parameter is comprised of a voltage across a plurality of cells.

19. Apparatus for synchronizing battery cell measurements, comprising:
a primary controller generating a primary sampling moment recurring at a fixed frequency; and
a secondary controller having a pulse generator operating at a multiple of the fixed frequency;
wherein the primary controller sends an immediate sync signal and a multiplex message to the secondary controller for starting the pulse generator, a count of pulse generator pulses determining a secondary sampling moment synchronized with the primary sampling moment.

* * * * *